United States Patent
Stickle (10) Patent No.: US 10,386,444 B1
(45) Date of Patent: Aug. 20, 2019

(54) SYSTEM AND METHOD OF VNA S-PARAMETER MEASUREMENT WITH A REMOTE RECEIVER

(71) Applicant: ANRITSU COMPANY, Morgan Hill, CA (US)

(72) Inventor: Kyle Stickle, Los Gatos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 235 days.

(21) Appl. No.: 15/295,761

(22) Filed: Oct. 17, 2016

Related U.S. Application Data (60) Provisional application No. 62/242,833, filed on Oct. 16, 2015.

(51) Int. Cl.
*G01R 35/00* (2006.01)
*H04L 7/033* (2006.01)
*G01R 27/28* (2006.01)

(52) U.S. Cl.
CPC .......... *G01R 35/005* (2013.01); *G01R 27/28* (2013.01); *H04L 7/0331* (2013.01)

(58) Field of Classification Search
CPC ................ G01S 13/282; G01S 7/4008; H03H 2210/012; H03H 2210/015; H04B 1/30; H04K 3/42; G01R 27/02; G01R 35/005; H04J 4/005
See application file for complete search history.

(56) References Cited

U.S. PATENT DOCUMENTS

| | | |
|---|---|---|
| 5,801,525 A | 9/1998 | Oldfield |
| 5,812,039 A | 9/1998 | Oldfield |
| 5,909,192 A | 6/1999 | Finch |
| 5,977,779 A | 11/1999 | Bradley |
| 6,049,212 A | 4/2000 | Oldfield |
| 6,291,984 B1 | 9/2001 | Wong |
| 6,316,945 B1 | 11/2001 | Kapetanic |
| 6,331,769 B1 | 12/2001 | Wong |
| 6,335,931 B1 * | 1/2002 | Strong ............ G06F 1/14 370/390 |
| 6,496,353 B1 | 12/2002 | Chio |
| 6,504,449 B2 | 1/2003 | Constantine |
| 6,509,821 B2 | 1/2003 | Oldfield |
| 6,525,631 B1 | 2/2003 | Oldfield |
| 6,529,844 B1 | 3/2003 | Kapetanic |

(Continued)

*Primary Examiner* — Elias Desta
(74) *Attorney, Agent, or Firm* — Tucker Ellis LLP (57) ABSTRACT

A method of synchronizing a reference oscillator frequency of a first network analyzer with a reference oscillator frequency of a second network analyzer through a device under test (DUT) includes measuring a drift in a transmitted signal measured at the second network analyzer. The method includes connecting the first network analyzer to a first end of the DUT and connecting the second network analyzer to a second end of the DUT. A local oscillator (LO) signal of the first network analyzer is locked to a reference frequency of the first network analyzer. A LO signal of the second network analyzer is locked to a reference frequency of the second network analyzer. A RF signal is transmitted from the first network analyzer to the second network analyzer and an intermediate frequency (IF) of the transmitted signal is generated using the LO signal of the second network analyzer. The second network analyzer measures the transmitted IF signal.

20 Claims, 8 Drawing Sheets

(56) References Cited

U.S. PATENT DOCUMENTS

| | | |
|---|---|---|
| 6,548,999 B2 | 4/2003 | Wong |
| 6,650,123 B2 | 11/2003 | Martens |
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |
| 6,711,225 B1 | 3/2004 | Sutardja |
| 6,714,898 B1 | 3/2004 | Kapetanic |
| 6,766,262 B2 | 7/2004 | Martens |
| 6,826,245 B1 | 11/2004 | Brown |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 | 5/2005 | Noujeim |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,023,374 B2 * | 4/2006 | Jossef ............... G01S 7/022 342/15 |
| 7,054,776 B2 | 5/2006 | Bradley |
| 7,068,046 B2 | 6/2006 | Martens |
| 7,088,111 B2 | 8/2006 | Noujeim |
| 7,108,527 B2 | 9/2006 | Oldfield |
| 7,126,347 B1 | 10/2006 | Bradley |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,496 B2 | 3/2009 | Schiano |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,792,230 B1 | 9/2010 | Gallagher |
| 7,795,230 B2 | 9/2010 | Michelet |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 3,156,167 A1 | 4/2012 | Bradley |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 * | 10/2012 | Noujeim ............... G01R 27/04 324/637 |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,718,586 B2 | 5/2014 | Martens |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2004/0076246 A1 | 4/2004 | Vanderperren |
| 2006/0250135 A1 | 11/2006 | Buchwald |
| 2011/0037667 A1 | 2/2011 | Varjonen |
| 2011/0050995 A1 | 3/2011 | Ozawa |
| 2016/0050032 A1 | 2/2016 | Emerson |

\* cited by examiner

SYSTEM AND METHOD OF VNA S-PARAMETER MEASUREMENT WITH A REMOTE RECEIVER

CLAIM OF PRIORITY

This application claims the benefit of priority to U.S. Provisional Application titled "SYSTEM AND METHOD OF VNA S-PARAMETER MEASUREMENT WITH A REMOTE RECEIVER", Application No. 62/242,833, filed Oct. 16, 2015, which application is herein incorporated by reference.

TECHNICAL FIELD

The present invention relates generally to systems and methods for measuring the electrical behavior of linear electrical networks when undergoing various steady state stimuli by electrical signals.

BACKGROUND

Vector network analyzers (VNA) are instruments that measure the magnitude and phase of signals as they pass through and/or are reflected from devices under test (DUTs). Typically, a DUT is connected to the VNA at connectors with short lengths of cable; however, there are some applications where the connectors of the DUT are very far away, and it is not feasible to connect the DUT connectors to the VNA with test port cables. For instance, if the DUT is coaxial cable installed in a building, one end of the cable may be hundreds of meters away from the other. The DUT could also be a radio link with transmitting and receiving antennas positioned very far apart.

There is a need for network analyzers capable of measuring transmission magnitude and phase (s21) through DUTs that have input and output ports very far apart.

SUMMARY

In accordance with an embodiment, a method of synchronizing a reference oscillator frequency of a first network analyzer with a reference oscillator frequency of a second network analyzer through a device under test (DUT) includes measuring a drift in a transmitted signal measured at the second network analyzer. The method includes connecting the first network analyzer to a first end of the DUT and connecting the second network analyzer to a second end of the DUT. A local oscillator (LO) signal of the first network analyzer is locked to a reference frequency of the first network analyzer. A local oscillator (LO) signal of the second network analyzer is locked to a reference frequency of the second network analyzer. A radio frequency (RF) signal is transmitted from the first network analyzer to the second network analyzer and an intermediate frequency (IF) of the transmitted signal is generated using the LO signal of the second network analyzer. The second network analyzer measures the transmitted IF signal.

The steps of transmitting and measuring are repeated while monitoring a phase of the IF signal measured by the second network analyzer. If the phase of the IF signal drifts, the second network analyzer determines a counteraction to reduce the drift. In an embodiment, a voltage to be applied to tune the reference frequency of the second network analyzer is determined based on the observed drift in the phase of the IF signal measured by the second network analyzer.

In accordance with an embodiment, a method can be applied to synchronize frequency sweep timing of a first network analyzer and a second network analyzer through a DUT. The method includes configuring the first and second network analyzers for a sweep. The sweep configuration includes a defined start and stop frequency and a number of measurement points. A synchronization frequency is provided for the first and second network analyzers. The synchronization frequency triggers a reference frequency synchronization process to synchronize a reference oscillator frequency of the first network analyzer with a reference oscillator frequency of the second network analyzer through the DUT. The first and second network analyzers are then connected and a calibration sweep is performed. The first network analyzer is then connected to a first end of the DUT and the second network analyzer is connected to a second end of the DUT. The reference frequency synchronization process is triggered via the synchronization frequency. Upon completion of the reference frequency synchronization process, the sweep is performed.

In accordance with an embodiment, a method can be applied to characterize phase performance a device under test (DUT) using a signal transmitted by a first network analyzer at a second local network analyzer through a DUT. The method includes configuring the first and second network analyzers for a sweep. The sweep configuration includes a defined start and stop frequency and a number of measurement points. Each step in the sweep includes setting a radio frequency (RF) signal to a first RF frequency, setting a local oscillator (LO) signal of the first network analyzer to a first LO frequency and a LO signal of the second network analyzer to the first LO frequency based on the first RF frequency, obtaining a first measurement of intermediate frequency (IF) of a transmitted signal at the second network analyzer based on the LO signal of the second network analyzer at the first LO frequency, setting the RF signal to a second RF frequency, obtaining a second measurement of IF of a transmitted signal at the second network analyzer based on the LO signal of the second network analyzer at the second LO frequency, and determining a change in phase by calculating a difference in phase of the first measurement and the second measurement.

A synchronization frequency is provided for the first and second network analyzers. The synchronization frequency triggers a reference frequency synchronization process to synchronize a reference oscillator frequency of the first network analyzer with a reference oscillator frequency of the second network analyzer through the DUT. The first and second network analyzers are then connected and a calibration sweep is performed. The first network analyzer is then connected to a first end of the DUT and the second network analyzer is connected to a second end of the DUT. A data link is established between the first network analyzer and the second network analyzer. The reference frequency synchronization process is triggered via the synchronization frequency. Upon completion of the reference frequency synchronization process, the sweep is performed. The phase performance of the DUT is then characterized based on the sweep.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

In the following description, numerous specific details are set forth to provide a thorough description of the invention. However, it will be apparent to those skilled in the art that the invention may be practiced without these specific details. In other instances, well-known features have not been described in detail so as not to obscure the invention.

The terms "host" and "remote" as used herein to refer to specific instruments. The terms are used for the sake of convenience and are not necessarily intended to suggest a master/slave relationship, for example. Instruments could alternatively be referred to as "first" and "second" or "A" and "B", etc. Reference to measurement instruments is not intended to imply a particular configuration or priority of instrument use.

There are some applications where connections to a device under test (DUT) are very far apart, and it is not feasible to connect both DUT connectors to a vector network analyzer (VNA). For example, if the DUT comprises coaxial cable installed in a building, one end of the coaxial cable may be hundreds of meters away from the other. The DUT could also be a radio link with transmitting and receiving antennas positioned very far apart from each other. Other applications includes DUTs such as cable harnesses within an aircraft or ship.

Figure 1:
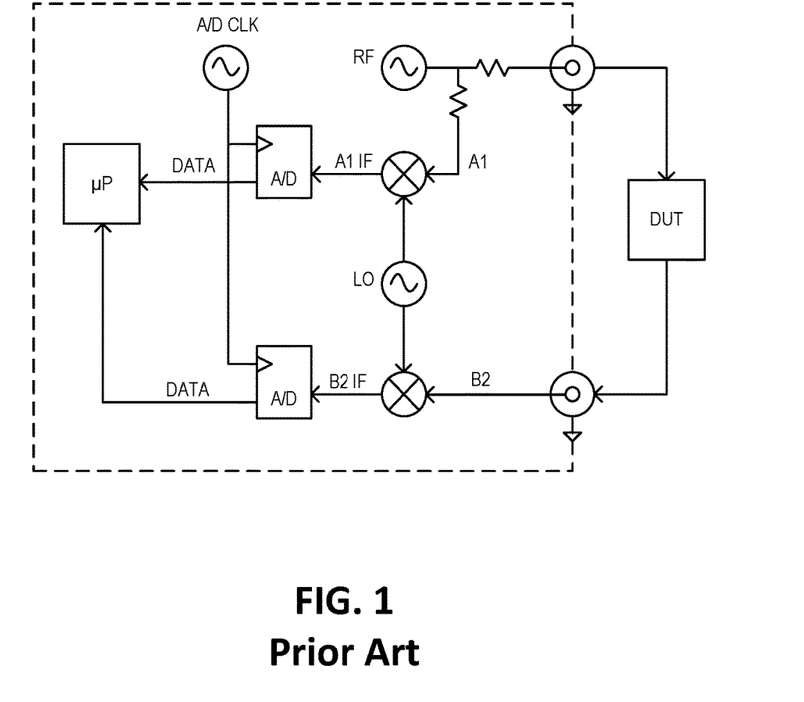
FIG. 1 is a circuit diagram of an instrument setup for measuring electrical behavior for a DUT using a measurement instrument, in accordance with the prior art.

FIG. 1 is a circuit diagram of a typical technique for measuring electrical behavior for a DUT using a single measurement instrument. The instrument is a VNA that includes two receivers in the same chassis. Standard VNAs typically apply such techniques when measuring scattering parameters (s-parameters). A first receiver, A1, of the VNA includes a local oscillator (LO) signal source, a reference mixer and a reference analog-to-digital (A/D) converter, and measures the magnitude and phase of a radio frequency (RF) signal sent out of a port of the VNA to the DUT. A second receiver, B2, of the VNA includes the same LO source, a transmit mixer and a transmit A/D converter, and measures the magnitude and phase of a RF signal transmitted through the DUT and back to the VNA. The ratio of B2/A1, after instrument and cable characteristics have been calibrated out, will yield the magnitude and phase of the signal transmission through the DUT (s-parameter S21). The configuration of FIG. 1 requires a long RF cable to reach the instrument at the far end of a remote DUT in applications such as described above. This can be problematic, and in many cases this is not a viable solution.

Figure 2:
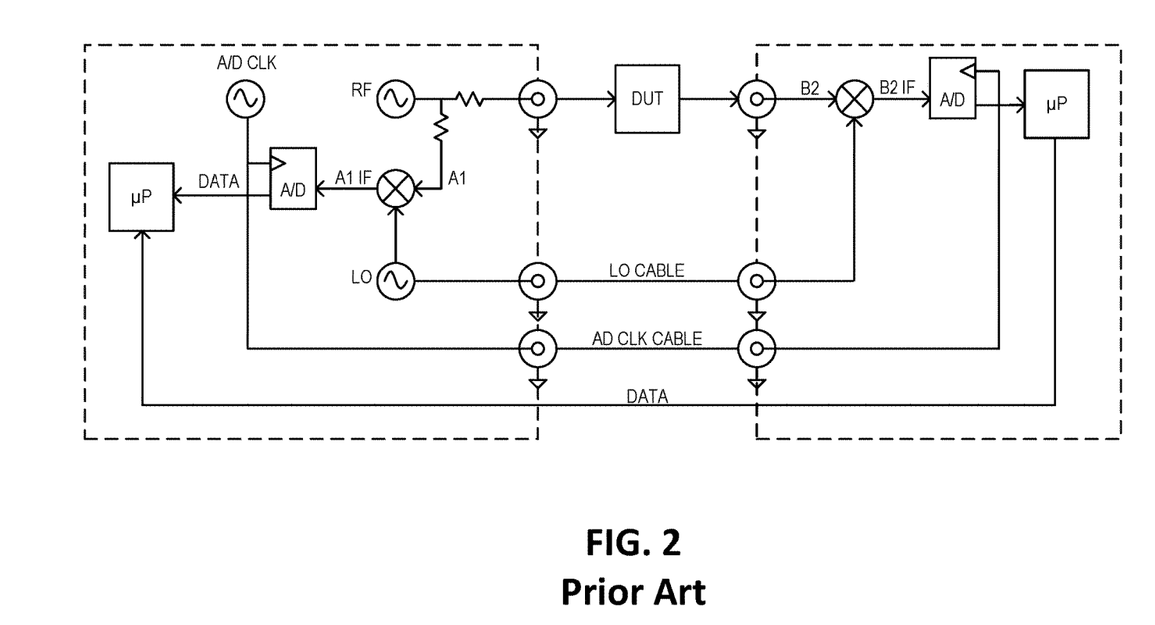
FIG. 2 is a circuit diagram of an instrument setup for measuring electrical behavior for a DUT using a pair of measurement instruments, in accordance with the prior art.

FIG. 2 is a circuit diagram of a typical technique for measuring electrical behavior for a DUT using a pair of measurement instruments. The technique relies on two instruments in separate chassis with cables connecting the LO signal and analog-to-digital converter clock signal (ADC CLK) between the two instruments and a data link. The technique need not require long RF cables to make a connection to a far end of a DUT. The LO signal is sent from a "host" instrument at a near end of the DUT to a "remote" instrument at the far end of the DUT through a cable. This ensures that the two receiving mixers (A1 and B2) are driven by a phase coherent synchronous LO source. The ADC CLK signal is also sent from "host" to "remote" to ensure that the ADCs are sampling the two IF signals synchronously. The B2 data is sent back from the "remote" instrument to the "host" instrument for processing.

Problematically, this configuration still requires very long cables for the LO signal and ADC CLK signal to reach the remote instrument at the far end of the DUT. Depending on the frequency range being measured, the LO signal may be a very high frequency that is heavily attenuated as it is sent through a long cable length. In many cases, running long lengths of cable for the LO signal and the ADC CLK signal is not a viable solution.

Figure 5:
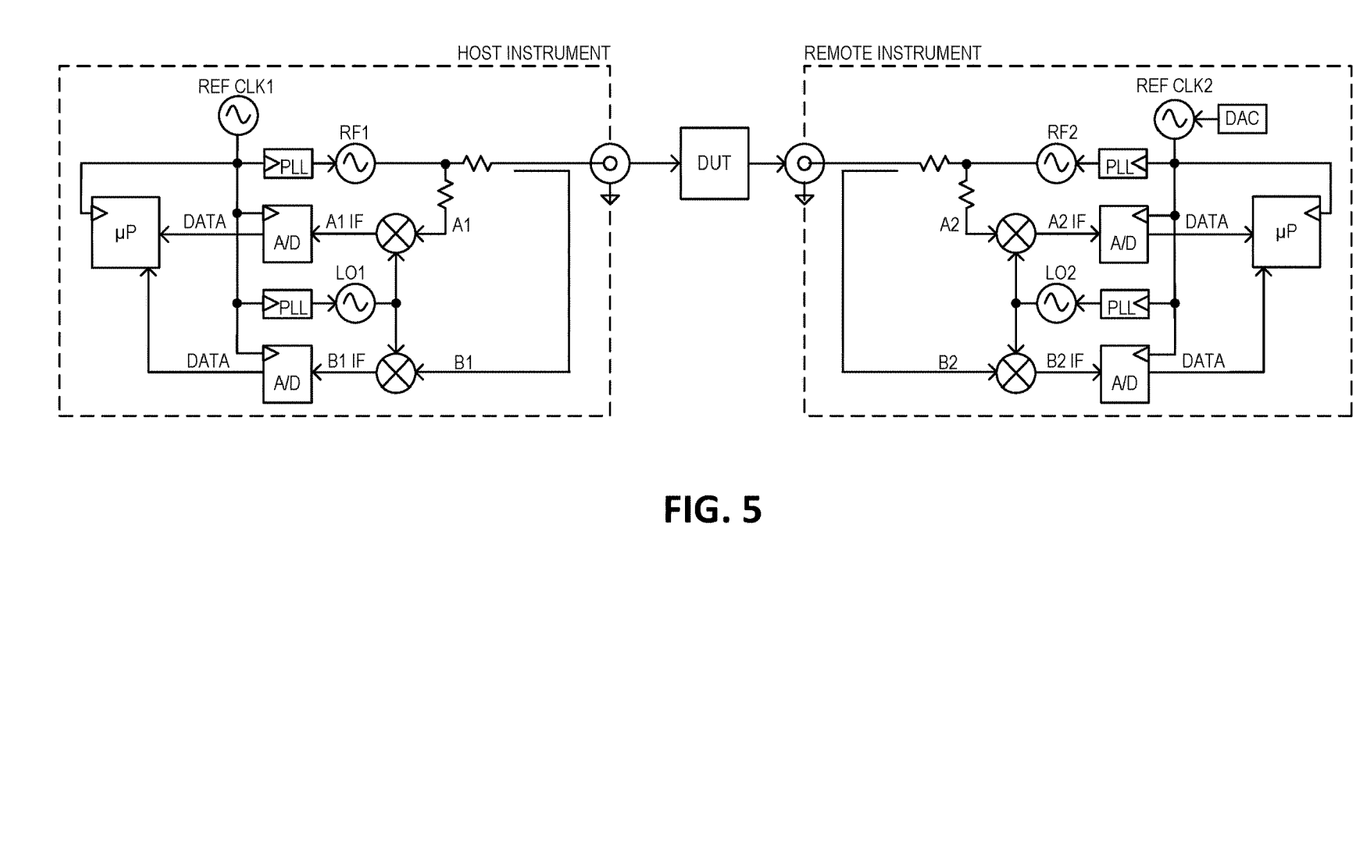
FIG. 5 is a circuit diagram of a system and method for measuring electrical behavior for a DUT using a pair of measurement instruments where a connector of the DUT is remote from at least one of the measurement instruments, in accordance with an embodiment.

Systems and methods in accordance with embodiments comprise network analyzers capable of measuring transmission magnitude and phase of DUTs with ports separated by large distances. Referring to FIG. 5, a system comprises two instruments: a "host" instrument and a "remote" instrument. Methods in accordance with embodiments can be used to measure remote S21 between the two instruments without the need of long connecting cables.

In accordance with embodiments, systems and methods can include a VNA capable of "remote S21" phase measurements, steps for synchronizing reference frequency oscillators in remote and host instruments, a method of synchronizing frequency sweeps without external trigger signals, steps for measuring change in phase vs frequency (dØ/df) with two asynchronous receivers called "host" and "remote", and steps for extrapolating dØ/df of a cable to obtain absolute phase.

Embodiments of systems and methods in accordance with the present invention can apply three separate techniques for obtaining information about the DUT. Each technique is used in performing remote S-parameter measurement. Technique 1 synchronizes reference oscillator frequencies through the DUT. Technique 2 synchronizes frequency sweep timing of the remote instrument to the host instrument. Technique 3 measures transmission phase with the remote receiver.

Technique 1: Synchronizing Reference Oscillator Frequencies Through DUT

Figure 3:
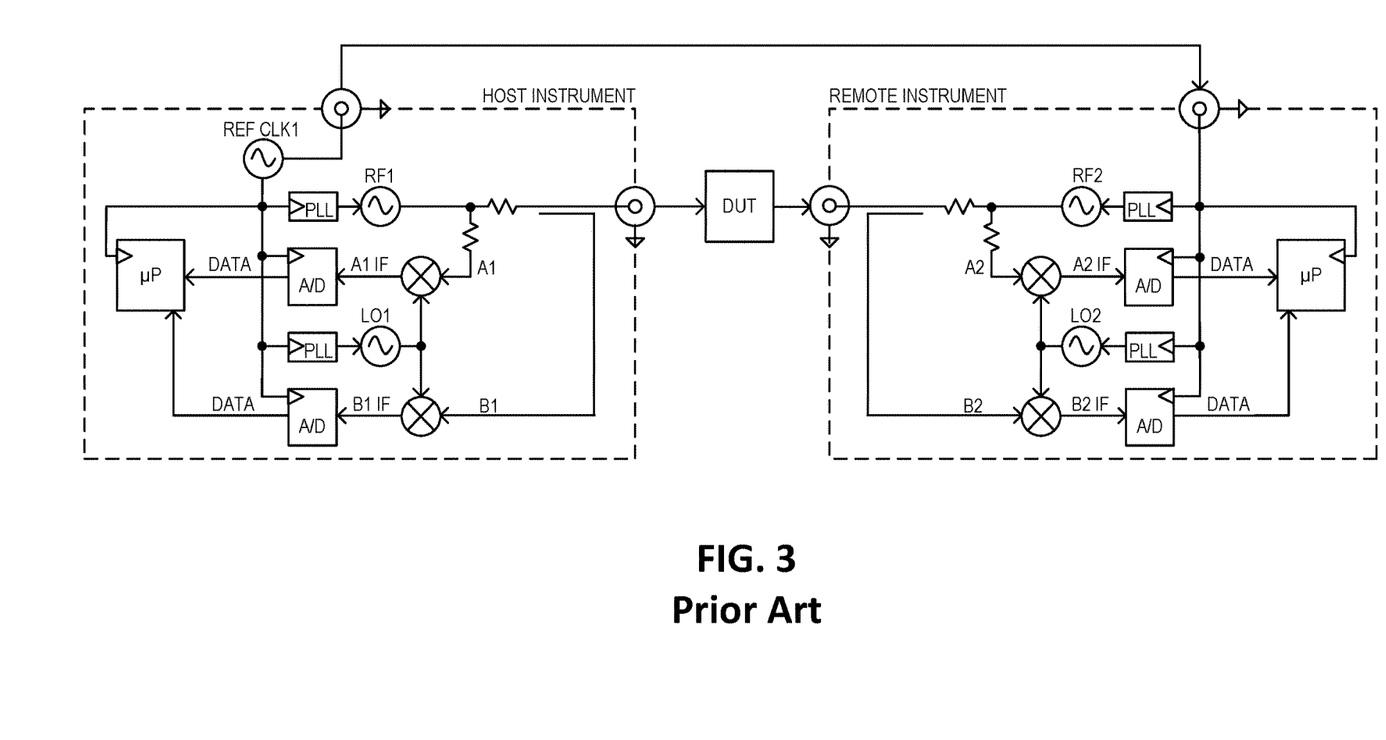
FIG. 3 is a circuit diagram of a system and method for measuring electrical behavior for a DUT using a pair of measurement instruments where a connector of the DUT is remote from at least one of the measurement instruments, wherein a reference oscillator is synchronized via a cable, in accordance with the prior art.

FIG. 3 illustrates an instrument setup for synchronizing reference oscillator frequencies, in accordance with the prior art. A frequency reference of a host instrument can be connected to a remote instrument with a cable. The reference frequency of the host instrument can be sent to the remote instrument through the cable. The remote instrument can then either use that reference frequency directly or phase lock its reference frequency to it, thereby synchronizing the frequency references. Unfortunately this configuration requires a cable to reach the instrument at the far end of the DUT in applications previously described. In many cases this is not a viable solution.

Figure 4:
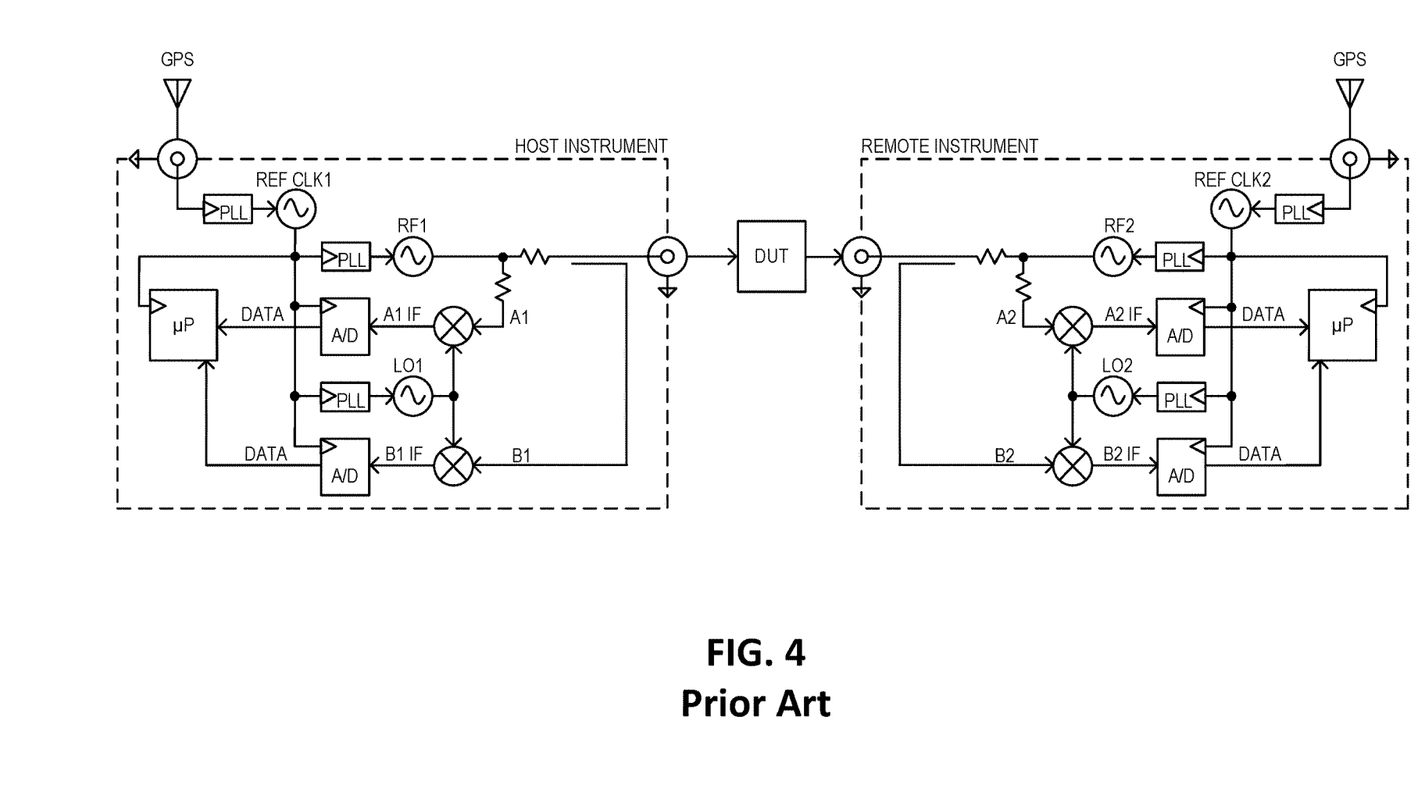
FIG. 4 is a circuit diagram of a system and method for measuring electrical behavior for a DUT using a pair of measurement instruments where a connector of the DUT is remote from at least one of the measurement instruments, wherein a reference oscillator is synchronized via a GPS signal, in accordance with the prior art.

Referring to FIG. 4, alternatively the reference oscillators of the host instrument and the remote instrument can be locked to a global positioning system (GPS) signal. This solution no longer requires a long cable to make the connection to the far end of the DUT. The reference frequencies of both instruments are locked to a GPS signal to become synchronous. Unfortunately this configuration still requires GPS antennas for both instruments and likely will not work indoors where signals from GPS satellites are typically not available. Sensitive GPS chips can sometimes get a fix (i.e., receive signals from enough satellites to determine a location) inside a building, however the resulting location is typically not accurate enough to be useful.

In accordance with an embodiment, a system and method can rely on synchronizing reference frequencies through a DUT. In an embodiment, a system and method need not rely on connecting cables or GPS antennas. Rather, a system and method can rely on a non-zero transmission response of the DUT to synchronize two instruments (e.g., a "host" instrument and a "remote" instrument).

Referring to FIG. 5, the following reference labels are used to describe the synchronization method, in accordance with an embodiment. Ref1 (labeled REF CLK1) is a reference frequency of a host instrument also used as the A/D converter clock of the host instrument. Ref2 (labeled REF CLK2) is a reference frequency of a remote instrument also used as the A/D converter clock of the remote instrument. RF1 is the RF source frequency of the host instrument. LO1 is the LO source frequency of the host instrument and LO2 is the LO source frequency of the remote instrument. IF2 is the transmitted IF frequency measured in the remote instrument ("B2" in VNA terminology). Syncfreq is the synchronization frequency where the DUT has a non-zero transmission response. N is the number of sample points used by an A/D fast Fourier transform (FFT) to calculate magnitude and phase of IF2. RF1 and LO 1 are phase locked to Ref1 with phase lock loop (PLL) circuits.

In an exemplary embodiment, the PLL uses a fractional-N PLL integrated circuit.

In a preferred embodiment, LO2 is locked to Ref2, and Ref2 also serves as the IF2 A/D converter clock. IF2 is chosen such that it would fall in the center of one of the A/D FFT bins if Ref1 and Ref2 were synchronized. The first Nyquist zone FFT bins of IF2 are located at $Ref2*k/N$, where k is a whole number from 1 to $N/2-1$, leading to the requirement that $IF2=LO2+RF1=Ref2*k/N$ where $k=1$ to $N/2-1$.

If the RF1 PLL is locked to Ref1 and the LO2 PLL is locked to Ref2, and Ref2 is also used to clock the A/D that samples IF2, then it is possible to satisfy the above requirements and synchronize Ref2 to Ref1.

The phase of the IF2 signal is monitored with the FFT of the IF2 A/D converter samples. If the host and remote instruments have differing reference frequencies Ref1 and Ref2, then there will be a drift in the absolute phase of IF2 as measured by the Ref2 ADC clock.

The drift in the absolute phase of IF2 can be counteracted by adjusting the tuning voltage on the reference oscillator. A reference oscillator typically allow frequency to be adjusted with a voltage. For example, drift can be counteracted with a DAC or by applying a voltage to a tune port until there is no more drift, or as small as can be achieved to be deemed to be synchronized. If the phase drift is negative, then the "remote" reference oscillator frequency needs to increase to counteract drift. Adjustment is continued until drift is minimized and the reference frequencies are then considered synchronized. Software of the instrument can be programmed to enable the instrument to monitor the phase of the IF signal in the remote instrument and counteract any phase drift by adjusting the voltage to the reference oscillator in the remote instrument.

Example 1

In a first example, a 24-bit fractional-N PLL, Syncfreq=3006.25 MHz, IF frequency=6.25 MHz
Ref1=Ref2=25 MHz
RF1: N=120, frac=_=4194304
RF1=25 MHz*(120+4194304/2^24)=3006.25 MHz exactly
LO2: N=120, frac=8388608
LO2=25 MHz*(120+8388608/2 24)=3012.5 MHz exactly
IF2=LO2−RF1=6.25 MHz exactly
N=4 sample points (has FFT bin at 6.25 MHz exactly)

The phase of 6.25 MHz IF2 signal is monitored with the FFT of the IF2 A/D converter samples. If the "host" and "remote" instruments have differing reference frequencies Ref1 and Ref2, then there will be a drift in the absolute phase of IF2 as measured by the Ref2 ADC clock. A DAC that fine tunes the Ref2 frequency is adjusted to counteract the drift. Continue adjustment until drift is minimized, the reference frequencies are then considered synchronized.

Example 2

In a second example, a 24-bit fractional-N PLL, Syncfreq=5000 MHz, IF frequency=4.6875 MHz
Ref1=Ref2=25 MHz
RF1: N=200, frac=0
RF1=25 MHz*(200+0/2^24)=5000 MHz exactly
LO2: N=200, frac=3145728
LO2=25 MHz*(120+3145728/2^24)=5004.6875 MHz exactly
IF2=LO2−RF1=4.6875 MHz exactly
N=16 sample points (has FFT bins at 1.5625, 3.125, 4.6875, 6.25, 7.8125, 9.375, 10.9375 MHz exactly)

The phase of 4.6875 MHz IF2 signal is monitored with the FFT of the IF2 A/D converter samples. A DAC that fine tunes the Ref2 frequency is adjusted to counteract phase drift. Continue adjustment until drift is minimized, the reference frequencies are then considered synchronized.

Technique 2: Synchronizing Frequency Sweep Timing of Remote to Host Instrument Through DUT Remote S21 measurement can be accomplished, for example, via the following steps.

1. The host and remote instruments are first configured for the desired frequency sweep. These frequency sweeps must have the same start/stop frequency and number of points. In addition, a synchronization frequency can be entered into the two instruments. This is the frequency where a reference frequency synchronization process is performed (see Technique 1).

2. The host and remote instruments are connected directly together.

3. A calibration sweep is performed. The calibration process begins with a synchronization of the reference clocks of the two instruments (see Technique 1). During the syncing process, the host instrument maintains the RF source frequency at the Syncfreq for an extended period of time to allow the remote instrument to synchronize its reference frequency. After this period of time the host instrument turns off the RF source. The IF signal measured by the remote instrument will vanish, signaling that the sweep is about to begin. The host instrument then steps its RF and LO source through the sweep frequencies waiting a fixed number of CPU clock cycles between measurement acquisitions. The remote instrument also steps its LO signal through the sweep frequencies waiting a fixed number of CPU clock cycles between measurement acquisitions. Since the REF CLKs of both instruments have been synchronized, and the microprocessors are clocked by the REF CLKs, the frequency stepping of the two instruments remains synchronized. During the calibration sweep, the remote instrument measures the B2 IF signal at each frequency.

4. After the calibration sweep, the host instrument is connected to the near end of the DUT and the remote instrument is connected to the far end of the DUT.

5. Reference clocks are then synced again. The host instrument loops through a Syncfreq and frequency sweep cycle where the RF source is first set to the Syncfreq for an extended period of time then stepped through the primary frequency sweep at fixed intervals. The remote instrument, which may have lost synchronization after transporting it to the far end of the DUT, sets its LO signal to receive the Syncfreq and waits until a signal is present. When a signal is detected, the frequency sync process is performed by the remote instrument. The B2 IF signal measured by the remote instrument will vanish when the host turns off the RF source, again signaling that the sweep is about to begin.

6. The host and remote instruments then step through the frequency sweep at fixed intervals. The host instrument can plot S11 of the DUT on its display, and the remote instrument can plot the magnitude of S21 on its display by subtracting the B2 calibration sweep data from the measured B2 sweep data when connected to the far end of the DUT. Further, the data can be saved to a file for later analysis.

7. The sync-sweep process can be repeated indefinitely for a continuous sweep.

Figure 7:
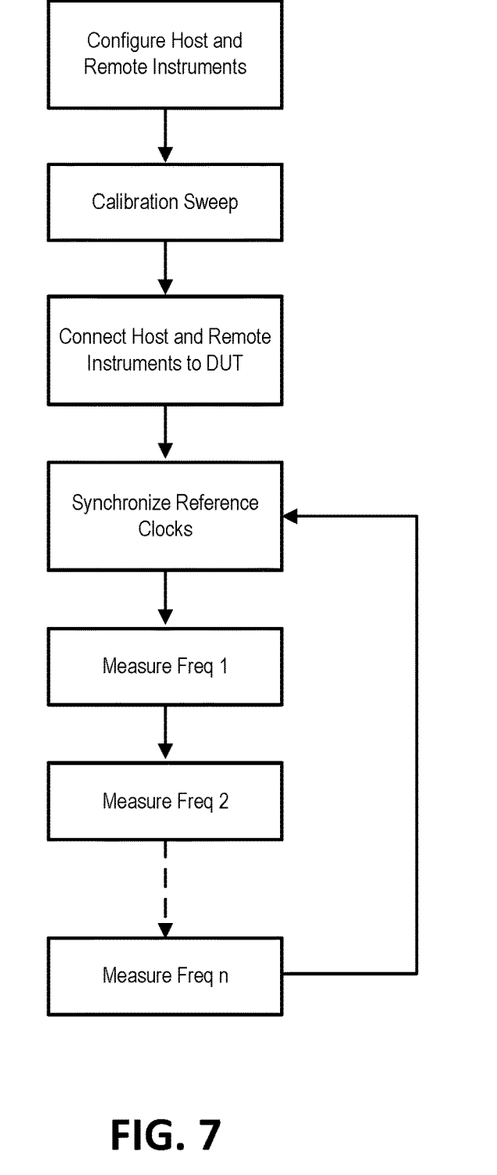
FIG. 7 is a flowchart for a method of for measuring electrical behavior for a DUT using a pair of measurement instruments where a connector of the DUT is remote from at least one of the measurement instruments, in accordance with an embodiment.

FIG. 7 is a flowchart of remote S21 magnitude measurement, in accordance with an embodiment. A host instrument and a remote instrument are configured and a calibration sweep is performed. The host instrument and the remote instrument are connected to the DUT, and the reference clocks are synchronized. Frequency 1 is measured. Frequency 2 is measured, and further frequency measurements are performed for N frequencies after which the reference clocks can again be synchronized.

Technique 3: Measuring Transmission Phase with Remote Receiver

Figure 6:
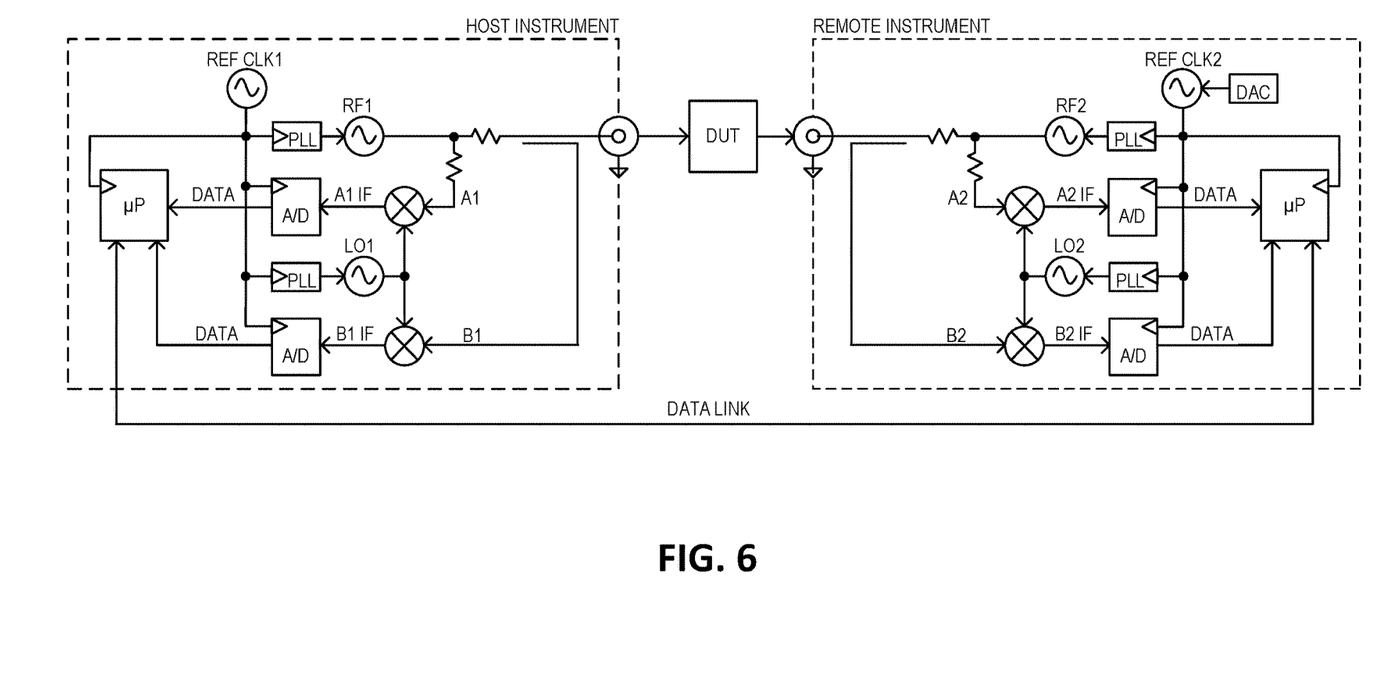
FIG. 6 is a circuit diagram of a system and method for measuring electrical behavior for a DUT using a pair of measurement instruments where a connector of the DUT is remote from at least one of the measurement instruments, in accordance with an embodiment.

FIG. 6 is a circuit diagram of a system and method for measuring electrical behavior for a DUT using a pair of measurement instruments where a connector of the DUT is remote from at least one of the measurement instruments, in accordance with an embodiment. Such a system and method can provide remote S-parameter magnitude and phase measurement.

The system and method relies on a data link between two measurement instruments and a non-zero transmission response of the DUT used for synchronizing the instruments. The data link can be, for example, a universal serial bus (USB), Bluetooth, Wi-Fi connection or any other means of data transmission. Data could even be sent through the DUT if the host and remote instrument receivers have the ability to transmit and receive modulated data.

Remote S21 phase measurement can be accomplished, for example, via the following steps.

In accordance with an embodiment, although the "host" and "remote" instruments do not need the same LO source or ADC CLKs, they can both be derived from highly stable reference sources such as a temperature compensated 10 MHz crystal or a GPS signal. These reference sources should be aligned such that they are as close as possible in frequency before the measurement takes place (for example, via a technique for frequency synchronization described above).

A problem with having two asynchronous LO sources (one for the A1 measurement and one for the B2 measurement) is that the phase of the two LO sources relative to each other will be random, and therefore the phase of S21 cannot be directly calculated. Even if the two LO sources were locked to the same reference frequency, fractional-N PLL circuitry that generates the LO signals from the reference frequency will have a random phase relationship unless the two sources were programmed at the exact same time.

If the two LO sources are kept fixed at near identical frequencies, and the RF source frequency is changed, two measurements can be obtained for A1 and B2 at the two RF source frequencies. Since the phase relation of LO1 and LO2 is unknown, the absolute phase at both RF frequencies is also unknown. However, since LO1 and LO2 were fixed during the RFfreq1 and RFfreq2 measurements, the change in phase can be calculated.

Keeping the LO frequencies fixed when changing the RF frequency implies the IF frequency will also change between the two measurement frequencies. An exception to this is if the LO frequency is centered between the two RF frequencies, and high-side downconversion is used for RFfreq1, and low-side downconversion is used for RFfreq2. If the high-side/low-side technique is not used, the IF receiver should be capable of receiving the two different IF frequencies.

A frequency sweep can be conducted in this manner that measures the change in S21 phase between points in a frequency sweep. If the DUT is a cable, the phase of S21 can be assumed to be 0 degrees at DC, and the absolute phase can be extrapolated from the delta phase measurements. If the DUT does not have a DC response, the change in phase measurements can still be used to calculate group delay, which is can be a more useful metric than absolute phase.

Characterization of group delay for a radio link can be useful in determining performance of the radio link. For example, one measurement for satellite links is group delay flatness. If the group delay is not flat, transmission of data through those satellite links could result in distortion in the data. Data can be dropped and/or the signal quality and the transmission of the data could become corrupted. Information about the group delay can be used to determine whether a communication link passes a predefined specification for group delay flatness, for example.

Figure 8:
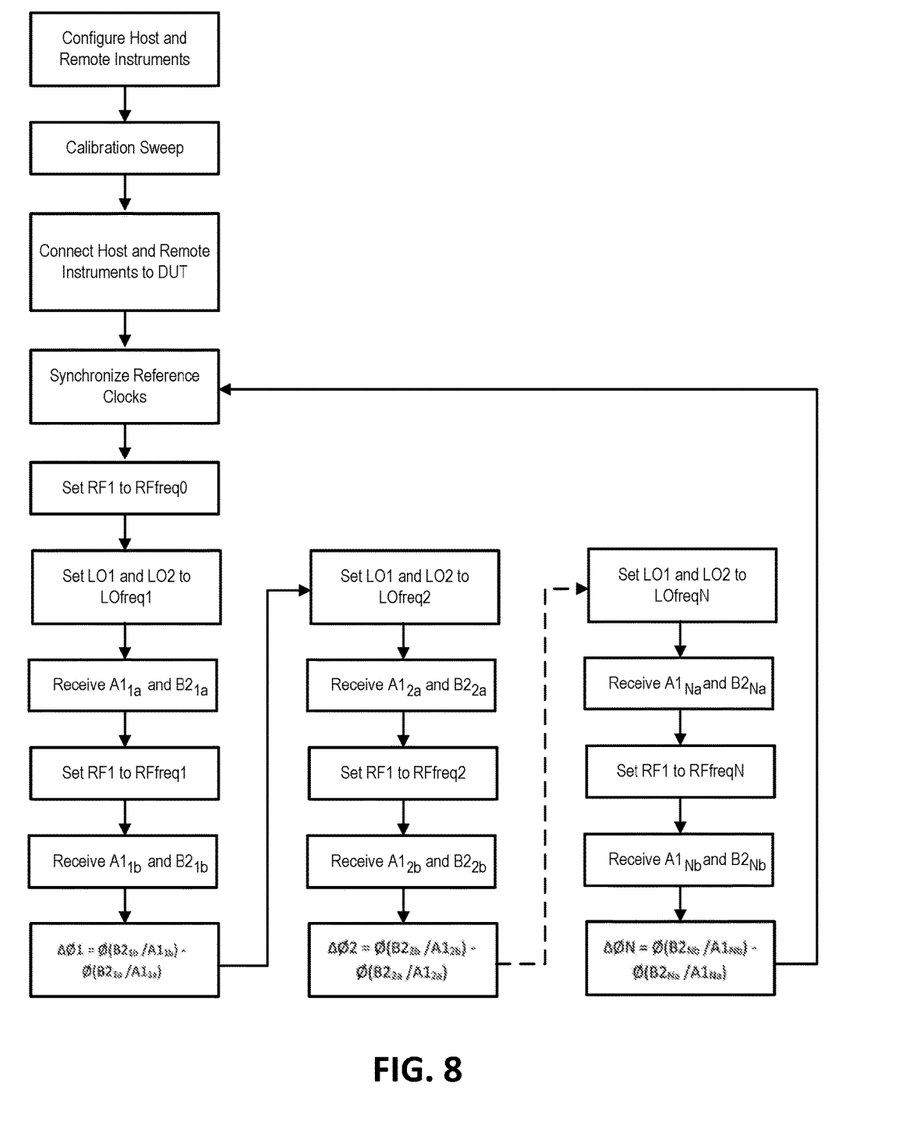
FIG. 8 is a flowchart for a method of for measuring electrical behavior for a DUT using a pair of measurement instruments where a connector of the DUT is remote from at least one of the measurement instruments, in accordance with an embodiment.

FIG. 8 is a flowchart of remote S21 phase measurement, in accordance with an embodiment. A host instrument and a remote instrument are configured and a calibration sweep is performed. The host instrument and the remote instrument are connected to the DUT, and the reference clocks are synchronized. RF1 is set to RFfreq0, LO1 and LO2 are set to LOfreq1 and $A1_{1a}$ and $B2_{1a}$ are received. RF1 is then set to RFfreq1 and $A1_{1b}$ and $B2_{1b}$ are received. The $\Delta\emptyset 1 = \emptyset(B2_{1b}/A1_{1b}) - \emptyset(B2_{1a}/A1_{1a})$. LO1 and LO2 are set to LOfreq2 and $A1_{2a}$ and $B2_{2a}$ are received. RF1 is set to RFfreq2 and $A1_{2b}$ and $B2_{2b}$ are received. The $\Delta\emptyset 2 = \emptyset(B2_{2b}/A1_{2b}) - \emptyset(B2_{2a}/A1_{2a})$. Further phase measurements are performed for N frequencies, with LO1 and LO2 set to LOfreqN and $A1_{Na}$ and $B2_{Na}$ being received, RF1 being set to RFfreqN and $A1_{Nb}$ and $B2_{Nb}$ being received and the $\Delta\emptyset N = \emptyset(B2_{Nb}/A1_{Nb}) - \emptyset(B2_{Na}/A1_{Na})$.

Remote S21 Phase Example: 20 MHz-6 GHz Sweep, 10 MHz Frequency Step Size, 5 MHz IF Frequency Conditions and steps for applying technique 3:
Ref1 and Ref2 are synchronized.
RF1 "host" source is set to 20 MHz.
LO1 "host" and LO2 "remote" are set to 25 MHz.
5 MHz A1 IF received by "host", B2 IF received by "remote" using high-side LO downconversion.
RF1 "host" source is set to 30 MHz. LO1 and LO2 stay parked at 25 MHz.
5 MHz A1 IF received by "host", B2 IF received by "remote" using low-side LO downconversion. The key is that the LO has not been reprogrammed on either instrument.

The change in phase of S21 from 20 MHz to 30 MHz can be calculated from the 20 MHz and 30 MHz data. The gap in ADC samples collected from 20 MHz RF and 30 MHz RF must also be the same for both instruments to ensure phase is not lost. Therefore, the microprocessor (µP)/field-programmable gate array (FPGA) in each instrument can control that gap by counting its clock cycles which are also locked to or derived from their respective reference clocks.

LO1 "host" and LO2 "remote" are set to 35 MHz.
5 MHz A1 IF received by "host", B2 IF received by "remote" using high-side LO downconversion.
RF1 "host" source is set to 40 MHz. LO1 and LO2 stay parked at 35 MHz.
5 MHz A1 IF received by "host", B2 IF received by "remote" using low-side LO downconversion.
The change in phase of S21 from 30 MHz to 40 MHz can be calculated from the 30 MHz and 40 MHz data.
The method is continued all the way to 6 GHz.
Either during the sweep or at the end of the sweep, the data from the "remote" instrument is sent to the "host" instrument for processing. This data can be sent using any communication technique such as Ethernet, USB or even a wireless link, etc., or even through the DUT if the source and receivers are capable of demodulating data.

Changes in phase are measured instead of absolute phase. If the DUT is a cable, we can assume the phase at 0 MHz is 0 degrees for S21 and extrapolate up to the 20 MHz-30 MHz phase slope to obtain absolute phase for the entire sweep. If the DUT does not have a DC connection, such as an antenna link, the delta phase data still can be used to obtain group delay of the link. As noted above, in many cases this can be a more useful measurement than absolute phase.

The A1 and B2 data can also be used for calculating magnitude of S21.

Impact of "Host" and "Remote" Reference Clocks Having a Small Frequency Difference If the reference clocks of the two instruments are not identical, there will be an error in the delta-phase measurement. This error in degrees can be quantified as: Error=PPM*LOFreq*T*360°, where: PPM is the difference of reference frequencies in parts per million, LOFreq is LO frequency in MHz, and T is the microprocessor (µP) controlled time gap between measurement points in seconds.

For a measurement with 0.001 PPM reference oscillator difference, 1000 MHz LO frequency, and 1 msec controlled gap in measurement points, the delta-phase measurement error would be 0.36 degrees. For a measurement with 0.1 PPM reference oscillator difference, 1000 MHz LO frequency, and 1 msec controlled gap in measurement points, the delta-phase measurement error would be 36 degrees, which is a large error. It can therefore be important to either align the reference frequencies with a frequency synchronization technique, as described above, or lock them together by running a cable between the "host" and "remote" instruments.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A method of synchronizing a reference oscillator frequency of a first network analyzer with a reference oscillator frequency of a second network analyzer through a device under test (DUT), comprising:
connecting the first network analyzer to a first end of the DUT;
connecting the second network analyzer to a second end of the DUT;
locking a local oscillator (LO) signal of the first network analyzer to a reference frequency of the first network analyzer;
locking a local oscillator (LO) signal of the second network analyzer to a reference frequency of the second network analyzer;
transmitting a radio frequency (RF) signal from the first network analyzer to the second network analyzer;
measuring an intermediate frequency (IF) of a transmitted signal at the second network analyzer generated using the LO signal of the second network analyzer;
repeating the steps of transmitting and measuring while monitoring a phase of the IF signal measured by the second network analyzer;

determining, based on an observed drift in the phase of the IF signal measured by the second network analyzer, a voltage to be applied to tune the reference frequency of the second network analyzer; and applying the determined voltage to thereby synchronize the reference oscillator frequency of the first network analyzer with the reference oscillator frequency of the second network analyzer.

2. The method of claim 1, further comprising:
performing a frequency sweep analysis of the DUT using the first network analyzer and the second network analyzer after synchronizing the reference oscillator frequency of the first network analyzer with the reference oscillator frequency of the second network analyzer.

3. The method of claim 1, further comprising:
performing a frequency sweep analysis of the DUT using the first network analyzer to transmit RF signals to the first end of the DUT and the second network analyzer to receive RF signals from the second end of the DUT after synchronizing the reference oscillator frequency of the first network analyzer with the reference oscillator frequency of the second network analyzer.

4. The method of claim 1 further comprising:
performing an S21 phase measurement of the DUT using the using the first network analyzer to transmit RF signals to the first end of the DUT and the second network analyzer to receive RF signals from the second end of the DUT after synchronizing the reference oscillator frequency of the first network analyzer with the reference oscillator frequency of the second network analyzer.

5. The method of claim 1, further comprising:
characterizing phase performance of DUT with a frequency sweep test using the first network analyzer and the second network analyzer after synchronizing the reference oscillator frequency of the first network analyzer with the reference oscillator frequency of the second network analyzer.

6. The method of claim 1, further comprising:
characterizing phase performance of DUT with a frequency sweep test using the first network analyzer to transmit RF signals to the first end of the DUT and the second network analyzer to receive RF signals from the second end of the DUT after synchronizing the reference oscillator frequency of the first network analyzer with the reference oscillator frequency of the second network analyzer.

7. The method of claim 1, further comprising:
configuring the first and second network analyzers for a sweep,
wherein the sweep includes a defined start and stop frequency and a number of measurement points; and
performing the sweep after synchronizing the reference oscillator frequency of the first network analyzer with the reference oscillator frequency of the second network analyzer.

8. The method of claim 1, further comprising:
configuring the first and second network analyzers for a sweep,
wherein the sweep includes a defined start and stop frequency and a number of measurement points;
performing the sweep after synchronizing the reference oscillator frequency of the first network analyzer with the reference oscillator frequency of the second network analyzer; and characterizing phase performance of the DUT based on said sweep.

9. The method of claim 1 further comprising:
configuring the first and second network analyzers for a sweep,
wherein the sweep includes a defined start and stop frequency and a number of measurement points;
performing the sweep after synchronizing the reference oscillator frequency of the first network analyzer with the reference oscillator frequency of the second network analyzer;
transmitting data regarding the phase performance of the DUT based on the sweep from the second network analyzer to the first network analyzer; and
characterizing phase performance of the DUT based on said sweep.

10. The method of claim 1, further comprising:
configuring the first and second network analyzers for a sweep,
wherein the sweep includes a defined start and stop frequency and a number of measurement points;
performing the sweep after synchronizing the reference oscillator frequency of the first network analyzer with the reference oscillator frequency of the second network analyzer;
transmitting data regarding the phase performance of the DUT based on the sweep from the second network analyzer to the first network analyzer;
processing, in the first network analyzer, the data regarding the phase performance of the DUT based on the sweep transmitted from the second network analyzer to the first network analyzer;
characterizing phase performance of the DUT based on said processing, in the first network analyzer, the data regarding the phase performance of the DUT based on the sweep transmitted from the second network analyzer to the first network analyzer.

11. A method of synchronizing frequency sweep timing of a first network analyzer and a second network analyzer through a device under test (DUT), comprising:
configuring the first and second network analyzers for a sweep,
wherein the sweep includes a defined start and stop frequency and a number of measurement points;
providing a synchronization frequency for the first and second network analyzers,
wherein the synchronization frequency triggers a reference frequency synchronization process to synchronize a reference oscillator frequency of the first network analyzer with a reference oscillator frequency of the second network analyzer through the DUT;
connecting the first and second network analyzers;
performing a calibration sweep;
connecting the first network analyzer to a first end of the DUT;
connecting the second network analyzer to a second end of the DUT;
triggering the reference frequency synchronization process via the synchronization frequency; and
performing, upon completion of the reference frequency synchronization process, the sweep.

12. The method of claim 11, further comprising:
characterizing phase performance of the DUT based on said sweep.

13. The method of claim 11, further comprising:
determining an S21 phase measurement of the DUT based on said sweep.

14. The method of claim 11, further comprising:
transmitting data regarding phase performance of the DUT based on the sweep from the second network analyzer to the first network analyzer; and
characterizing phase performance of the DUT based on said sweep.

15. The method of claim 11, further comprising:
transmitting data measured during the sweep from the second network analyzer to the first network analyzer;
processing, in the first network analyzer, the data measured during the sweep transmitted from the second network analyzer to the first network analyzer; and
characterizing performance of the DUT based on said processing, in the first network analyzer, of the data measured during the sweep.

16. The method of claim 11, further comprising:
transmitting data measured during the sweep from the second network analyzer to the first network analyzer;
processing, in the first network analyzer, the data measured during the sweep transmitted from the second network analyzer to the first network analyzer; and
characterizing phases performance of the DUT based on said processing, in the first network analyzer, of the data measured during the sweep.

17. A method of characterizing phase performance of a device under test (DUT) using a signal transmitted by a first network analyzer at a second local network analyzer through a DUT, comprising:
configuring the first and second network analyzers for a sweep,
wherein the sweep includes a defined start and stop frequency and a number of measurement points,
wherein each step in the sweep further includes
setting a radio frequency (RF) signal to a first RF frequency,
setting a local oscillator (LO) signal of the first network analyzer to a first LO frequency and a LO signal of the second network analyzer to the first LO frequency based on the first RF frequency,
obtaining a first measurement of intermediate frequency (IF) of a transmitted signal at the second network analyzer based on the LO signal of the second network analyzer at the first LO frequency,
setting the RF signal to a second RF frequency,
obtaining a second measurement of IF of a transmitted signal at the second network analyzer based on the LO signal of the second network analyzer at the second LO frequency,
determining a change in phase by calculating a difference in phase of the first measurement and the second measurement;
providing a synchronization frequency for the first and second network analyzers,
wherein the synchronization frequency triggers a reference frequency synchronization process to synchronize a reference oscillator frequency of the first network analyzer with a reference oscillator frequency of the second network analyzer through the DUT;
connecting the first and second network analyzers;
performing a calibration sweep;
connecting the first network analyzer to a first end of the DUT;
connecting the second network analyzer to a second end of the DUT;
establishing a data link between the first network analyzer and the second network analyzer;
triggering the reference frequency synchronization process via the synchronization frequency;
performing, upon completion of the reference frequency synchronization process, the sweep; and
characterizing phase performance of DUT based on the sweep.

18. The method of claim 17, further comprising:
transmitting data regarding the phase performance of the DUT based on the sweep from the second network analyzer to the first network analyzer.

19. The method of claim 17, further comprising:
transmitting data regarding the phase performance of the DUT based on the sweep from the second network analyzer to the first network analyzer; and
processing, in the first network analyzer, the data regarding the phase performance of the DUT based on the sweep transmitted from the second network analyzer to the first network analyzer.

20. The method of claim 17, wherein characterizing phase performance of DUT based on the sweep comprises an S21 phase measurement of the DUT.

* * * * *